(12) United States Patent
Faybishenko et al.

(10) Patent No.: US 7,137,444 B2
(45) Date of Patent: Nov. 21, 2006

(54) HEAT-TRANSFER INTERFACE DEVICE BETWEEN A SOURCE OF HEAT AND A HEAT-RECEIVING OBJECT

(75) Inventors: Victor Faybishenko, Union City, CA (US); Ashley Burfield, Redwood Shores, CA (US)

(73) Assignee: Pacific Rubber & Packing, Inc., San Carlos, CA (US)

( * ) Notice: Subject to any disclaimer, the term of this patent is extended or adjusted under 35 U.S.C. 154(b) by 487 days.

(21) Appl. No.: 10/656,950

(22) Filed: Sep. 8, 2003

(65) Prior Publication Data

US 2005/0067157 A1 Mar. 31, 2005

(51) Int. Cl.
F28F 7/00 (2006.01)

(52) U.S. Cl. ............... 165/185; 165/80.3; 428/403; 428/421

(58) Field of Classification Search ........... 165/185, 165/80.3, 104.33; 428/389, 403, 421
See application file for complete search history.

(56) References Cited

U.S. PATENT DOCUMENTS

| | | | | |
|---|---|---|---|---|
| 4,654,754 A | * | 3/1987 | Daszkowski | 361/708 |
| 4,782,893 A | * | 11/1988 | Thomas | 165/185 |
| 5,281,324 A | * | 1/1994 | Kiesele et al. | 204/415 |
| 5,545,473 A | * | 8/1996 | Ameen et al. | 428/212 |
| 5,660,917 A | * | 8/1997 | Fujimori et al. | 428/195.1 |
| 5,679,457 A | * | 10/1997 | Bergerson | 428/344 |
| 5,783,862 A | * | 7/1998 | Deeney | 257/714 |
| 5,945,217 A | * | 8/1999 | Hanrahan | 428/389 |
| 6,054,198 A | * | 4/2000 | Bunyan et al. | 428/40.5 |
| 6,165,612 A | * | 12/2000 | Misra | 428/344 |
| 6,365,063 B1 | * | 4/2002 | Collins et al. | 216/71 |
| 6,376,385 B1 | * | 4/2002 | Lilleland et al. | 438/710 |
| 6,422,172 B1 | | 7/2002 | Tanaka et al. | |
| 2003/0077454 A1 | * | 4/2003 | Jing | 428/421 |

OTHER PUBLICATIONS

"Industrial Plasma Engineering" by J.Reece Roth, vol. 1, Institute of Physics Publishing, 1995, pp. 412-413.
T-gon 200 Series Isulators of Thermagon, Inc., OH, USA.
Catologs of Mold-Tech, Standex-Engrooving group.

* cited by examiner

Primary Examiner—Eric Keasel

(57) ABSTRACT

What is proposed is a heat-transfer interface device for use in a range of up 320° C. working temperatures for transfer of heat from a source of heat to a heat-receiving object under severe conditions. The device comprises an elastomeric material filled with an electrically-nonconductive and thermally-conductive filler material. The elastomeric material may have recesses on the surface or the surface may be curved, e.g., on the side facing the source of heat for forming a space between the surface of the device and the mating surface of the source of heat. The elastomeric material is clamped between the heat source and heat receiver in a compressed state so that when it is expanded under the effect of an increased temperature, the material is redistributed and the recesses are flattened. The elastomeric material comprises perfluoroelastomer polymer, and the filler can be selected from boron nitride, aluminum nitride, beryllium oxide, etc. If necessary, a combined mixing-assisting and compression-set reducing agent in the form of perfluoropolyether can be added.

32 Claims, 4 Drawing Sheets

US 7,137,444 B2

HEAT-TRANSFER INTERFACE DEVICE BETWEEN A SOURCE OF HEAT AND A HEAT-RECEIVING OBJECT

FIELD OF THE INVENTION

The present invention relates to a device and method for controlling and stabilizing heat-transfer conditions between the heat source and heat-receiving object, in particular to a device and method for controlling and stabilizing heat-transfer conditions in apparatuses in which the main process is associated with generation and transfer of heat and in which stability of heat-transfer conditions is a critical factor for normal operation of the apparatus. The invention may find use in applications where heat is transferred through an electrically insulated interface between parts made of materials with different physical properties such as coefficient of thermal expansion.

BACKGROUND OF THE INVENTION

In many circumstances, reliable and stable removal of heat from a source of heat to the surrounding environment, as well as delivery of heat to a working chamber of a processing apparatus may be a critical issue, wherein violation of normal thermal conditions may lead to abnormal operation of the apparatus or even to a more serious consequences. One such example is removal of heat from RF coils used in inductively coupled plasma reactor for excitation of plasma simultaneously with maintaining the working gas inside the plasma-generation chamber at a predetermined operation temperature. A typical inductively-coupled plasma (hereinafter referred to as ICP) reactor has a housing made, e.g., from a dielectric material, with a flat top surface which supports a flat spiral inductive coil, e.g., an RF coil designed for excitation of plasma in the reactor. The RF coil is separated from the plasma by quartz or other dielectric plate. The RF coil may also be arranged on the outer side surfaces of the reactor. The aforementioned coils are activated by an alternative a.c. voltage from a high-power generator operating, e.g., on a frequency of 2 or 13.72 MHz. The interior of the reactor is maintained under a deep vacuum from fractions mTorr to 10–20 mTorrs. A working gas required for generation of specific plasma is supplied to the reactor and should be maintained during generation of plasma at a predetermined stable temperature. Examples of such gases are oxygen, chlorine, $NF_3$, $CF_4$, etc., or mixtures of the above.

An example of an ICP reactor with a flat spiral RF coil placed onto the top of the plasma reactor is disclosed, e.g., in U.S. Pat. No. 6,422,172 issued in 2002 to J. Tanaka, et al. There exist many other ICP reactors of the aforementioned type and they become so common that some of them are even included into handbooks (see "Industrial Plasma Engineering" by J. Reece Roth, Vol. 1, Institute of Physics Publishing, 1995, pp. 412–413.)

In operation of the ICP reactor, the RF coils consume a significant power which may reach 10 kW or higher. A significant part of this energy is converted into Joule heat (e.g., up to 1 kW or higher). In other words, the RF coils of an ICP reactor work under very severe thermal-exchange conditions required for removal of the excessive heat. Therefore, in a majority of real ICP reactors, the RF coil assemblies are made in the form of hollow spiral tubes having a round or rectangular cross-section for circulation of a cooling agent through the coil. Such RF coils are normally made from a material of high electrical and thermal conductivity, e.g., from copper or the like, and the cooling medium comprises deionized water.

However, it is understood that during operation of the plasma reactor, heat is generated not only in the coils, but also in the volume of the generated plasma inside the reactor. In some cases, the technological process requires that this heat must be removed also from the plasma-generation chamber, e.g., for maintaining the working gas of the plasma-generation chamber at a relatively low temperature. In this case, the coolant circulating through the interior of hollow RF coils is used as a medium for removal of heat not only from the RF coils but from the plasma-generation chamber as well.

On the other hand, operation conditions may exist when gas in the same reactor should be maintained at a relatively high temperature and when the heat generated by plasma itself appears to be insufficient and the use of an external heat source is required.

Designs of such reactors should satisfy a number of conditions, some of which are contradictory with each other. For example, they have to operate efficiently under conditions of a wide temperature range from room temperature to 200° C. or sometimes to 300° C. Heat transfer interface between a heat source, e.g., RF coils, and the interior of the processing chamber should provide efficient transfer of heat and at the same time should function as an efficient electric insulator between turns of the coil. Heretofore, in a majority of cases the above condition of electrical non-conductivity was met by merely producing the coil-supporting cover of the reactor from a dielectric material, while the condition of good thermal conductivity was met by providing heat-transfer contact in interface between the coil and the reactor cover. In accordance with the existing practice, the thermal interface was carried out either through rigid contact or by utilizing thermally conductive elastic insulators such as, e.g., T-gon 200 Series insulators produced by Thermagon, Inc., OH, USA. However, the best thermally conductive elastic insulators of the aforementioned type are rated maximum to 200° C. and therefore are not applicable for high-temperature applications and in reality are effective at working temperature that do not exceed 150–180° C.

Furthermore, in some applications, e.g., RF plasma reactors, the materials that participate in heat-transfer and electrically insulated interface, such as the RF coil, which is made from a material of high electrical conductivity, e.g., as copper, and the dielectric material of the reactor cover, such as ceramic or quartz, have different coefficients of thermal expansion. This difference may be as high as 10 times or more. At the same time, the diameter of the spiral coil assembly and the diameter of the reactor cover may reach 500 mm or greater. It is obvious that when the working temperature changes in a very wide range, e.g., from room temperature to 300° C. or more, the relative displacements between RF coil and the reactor cover become significant, so that peripheral areas of the coil will be shifted in the radial inward and outward directions with respect to the surface of the cover for a distance of several millimeters or more. It is understood that such shifts of the coil will violate the plasma distribution pattern on the treated object, such as a semiconductor substrate. Another consequence of such differences in coefficients of thermal expansion is thermal warping of the contacting parts, i.e., the spiral coil and the reactor cover, which results in violation of uniformity of heat-transfer contact between the two thermally-conductive links. In other words, the aforementioned condition leads to violation of thermal interface and hence to nonuniformity of the generated plasma. More specifically, violation of spatial uniformity in heat transfer conditions may leads to local non-uniformities of treatment, and in the worst case to overheating and even to damage of the apparatus components.

It should be noted that in apparatuses such as RF plasma reactors that utilize vacuum in working chambers the vacuum generate an additional force acting in the direction of violation of the interface. The above condition is aggravated with the raise of the working temperature whereby the sagging of the vacuum chamber walls is increased.

On the other hand, when the temperature of the working gas in reactors or apparatus based on high-temperature processes is insufficient, these apparatus cannot effectively operate.

The applicants are not aware of any existing heat-transfer devices that maintain stable heat-transfer contact between parts subject to significant thermal deformations and operating under temperatures up to 350° C.

OBJECTS OF THE INVENTION

It is an object of the invention to provide a heat-transfer interface device between a source of heat and a heat-receiving object for controlling and stabilizing heat transfer conditions. It is another object to provide the aforementioned heat-transfer interface device for use under conditions of heat transfer between the parts made from materials with different physical properties. Still another object is to provide the aforementioned heat-transfer interface device, in which heat-transfer conditions remain unchanged even when the aforementioned parts are thermally deformed within the range of working temperatures up to 350° C. A further object is to provide the aforementioned device wherein stable heat-transfer conditions are achieved by imparting a special shape to at least one of the contacting members of the interface device. It is another object to provide a reliable and stable thermally-conductive and electrically non-conductive interface between the RF coil and the top of the RF reactor. Still another object is to provide the aforementioned assembly, which ensures generation of uniform plasma and thus uniform plasma treatment in the inductively coupled plasma reactor. A further object is to provide the aforementioned device that incorporates RF coils and heating elements embedded into an elastic material filled with thermally conductive and electrically non-conductive filler. It is another object is to provide an elastomeric interface that can operate at temperatures over 200° C. A further object is to provide a method for improving and stabilizing a heat-transfer interface between the RF coil and the inductively coupled plasma reactor. Another object is to provide a method for stabilization and improvement of heat transfer conditions between the external source of heat and the interior of the processing chamber.

What is proposed is a heat-transfer interface device for use in a range of up 320° C. working temperatures for transfer of heat from a source of heat to a heat receiving object under severe conditions. The device comprises an elastomeric material filled with an electrically-nonconductive and thermally-conductive filler material. The elastomeric material may have recesses on the surface or the surface may be curved, e.g., on the side facing the source of heat for forming a space between the surface of the device and the mating surface of the source of heat. The elastomeric material is clamped between the heat source and heat receiver in a compressed state so that when it is expanded under the effect of an increased temperature, the material is redistributed and the recesses are flattened. The elastomeric material comprises perfluoroelastomer polymer, and the filler can be selected from boron nitride, aluminum nitride, beryllium oxide, etc. If necessary, a combined mixing-assisting and compression-set reducing agent in the form of perfluoropolyether can be added.

In a practical example the thermal interface device of the invention can be used for thermal management, e.g., of heat-transfer conditions in processing apparatus, such as an RF reactor, between the RF coil, RF reactor working chamber, and the surrounding environment. In this case, the elastomeric material may contain an RF coil with a cooling medium circulating through the interior of the coil and functioning as the aforementioned heat-receiving object. In a specific RF reactor, where the device of the invention can be used, the shaped elastomeric material is compressed and is fixed to the reactor top or to the side of the reactor (for side coils) by clamping means, e.g., bolts. Since the elastomeric material is fixed, when the temperature of the elastomer is increased, the compression force is reduced, and under the effect of thermal deformations the entire interface device is deformed and is subjected to warping, sagging and formation of free volume that could impair the interface conditions. However, the compression force acting on the elastomeric material softened under the effect of heat displaces this material into the aforementioned free spaces whereby the heat-transfer conditions are preserved. As the volume occupied by the recesses is significantly smaller than the volume of the entire elastomeric material, the provision of the recess will not affect the heat-transfer properties of the device as a whole.

Furthermore, when the elastomer is compressed, it develops anisotropy in the direction of the compression. Since the material of the elastomer is filled with finely dispersed powder or fibers, the aforementioned compression will at least partially protect the heat-transfer device from the loss of thermal conductivity. The assembly can also be used for removal of heat from the RF coils and from the interior of the plasma-generation chamber by passing through the hollow coils a cooling medium and transferring the heat to the surrounding environment through the thermally conductive elastomers. The cooler/heater element is made hollow for circulation of the heating/cooling medium in order to selectively use this element for cooling or for heating the working gas in the plasma-generation chamber. Alternatively, the supply of the cooling medium can be discontinued, and the cooler/heater element and/or the hollow RF coil can be activated for transfer of heat to the plasma chamber in order to increase the temperature of the working gas in the chamber. If necessary, the heat transfer medium can be used for cooling the working gas in the plasma generation chamber.

DETAILED DESCRIPTION OF THE INVENTION

Figure 1:
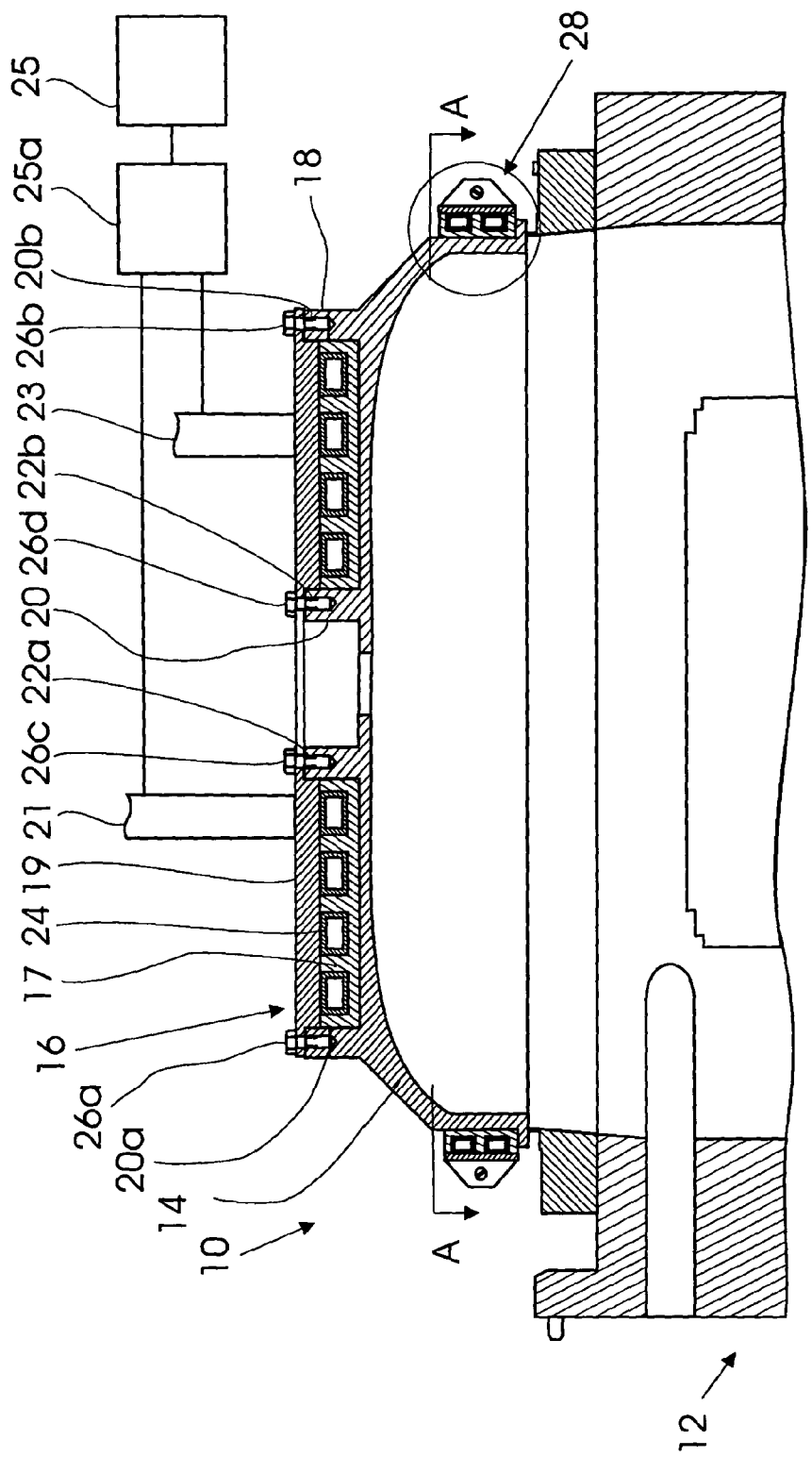
FIG. 1 is vertical sectional view of an ICP reactor equipped with the coil assembly device of the invention, wherein the hollow water-cooled RF coils are embedded in an elastomeric material.

FIG. 1 is a vertical sectional view of an ICP reactor equipped with the coil assembly of the invention. It is understood that the ICP reactor is shown only as one of possible applications of the heat-transfer interface device of the invention. In this drawing, the ICP reactor, which as a whole is designated by reference numeral 10, consists of a sealed ICP reactor housing 12 made from a dielectric material, e.g., a ceramic, and connected to a vacuum system and to a working gas supply system (not shown in FIG. 1). The upper open side of the housing 12 is sealingly closed with a dome-like ceramic cover 14 which in general has the same shape and construction as a conventional reactor housing cover, with the exception that the external top surface of the cover 14 has a specific shape for accommodation of a heat-transfer interface device 16 of the invention. More specifically, the cover has an outer vertical cylindrical project 18 and an inner vertical cylindrical projection 20 which may be concentric to the outer projection 18. Threaded holes, four of which 20a, 20b and 22a, 22b are shown in FIG. 1, can be provided in the top surfaces of the outer projection 18 and of the inner projection 20, respectively.

The annular space between the outer projection 18 and the inner projection 20 is used for accommodation of a heat-transfer interface device 16 of the invention. This device 16 consists of an annular body 17 made of an elastomeric material which is described in detail below and which is filled with a finely dispersed powder or fiber-like non-electrically conductive material having high coefficient of thermal conductivity. A hollow spiral electromagnetic coil, such as RF coil 24, is embedded into the elastomeric material, and the interior of the coil is used for circulation of a cooling medium such as deionized water.

The elastomeric material 17 is compressed, e.g., by bolts 26a, 26b, 26c, 26d, . . . screwed into the aforementioned threaded holes 20a, 20b and 22a, 22b . . . and inserted via an annular ceramic plate 19.

Figure 2A:
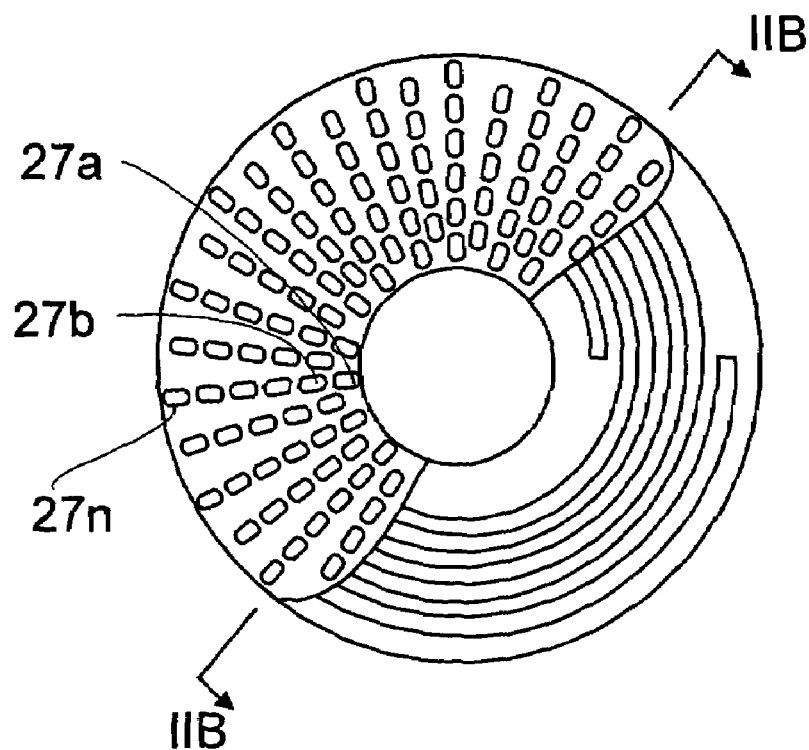
FIG. 2A is a top view on the heat-transfer interface device of the invention that shows arrangement of recesses formed on the surface of the elastomeric layer.
Figure 2B:
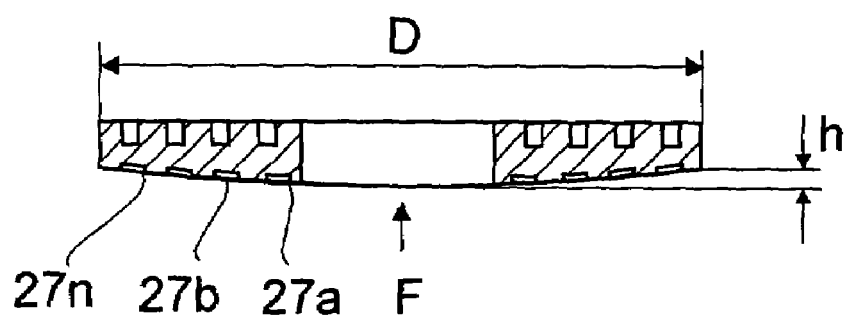
FIG. 2B is a side sectional view of the device of FIG. 2A along the line IIB—IIB in a non-compressed state of the elastomeric layer; the depth of the recesses is exaggerated.

FIG. 2A is a top view on the heat-transfer interface device 16 of the invention that illustrates arrangement of recesses formed on the surface of the elastomeric layer 17, and FIG. 2B is a side sectional view of the device of FIG. 2A in a non-compressed state of the elastomeric layer 17. It can be seen that in a non-compressed state the device 16 has a convex shape, at least on one side, e.g., on the side facing the reactor cover 14. Furthermore, the surface of the elastomeric material or layer 17 has a pattern or texturing formed by shallow recesses 27a, 27b, . . . 27n. In the embodiment of FIG. 2A and FIG. 2B these recesses are arranged in radial rows, which is shown only as an example, and it is understood that any other patterns are possible. Furthermore, the depth of the recesses in FIG. 2B is exaggerated. The texturing can be produced in accordance with Mold-Tech visual texture standards of Standex Engraving Group, Il, U.S.A. A ratio of the height "h" of the convex profile (FIG. 2B) to the diameter "D" of the device 16 is normally within the range of $0.001 < h/D < 0.1$.

It can be seen from FIG. 1 that after compression of the elastomeric layer 17 in a working position of the device, the convex profile of the elastomeric layer 17 is flattened under the effect of the compression force F acting in the direction shown by the arrow in FIG. 2B. Furthermore, under the effect of force F, in a compressed state the recesses 27a, 27b, . . . 27n become shallower or can be eliminated.

As can be seen from FIG. 1, the RF coil 24 has input terminals, 21 and 23, which protrude outside the ceramic plate 19 and are connected to a power supply unit 25 via an impedance-matching device 25a. It is understood that similar terminals connected to a respective power supply (not shown in the drawings) are also available at the helical RF coils 34 (FIG. 3) of the sidewall heat-transfer interface device 28.

It is seen that the elastomeric material 17 is clamped against movements in the vertical direction by bolts 26a, 26b, 26c and 26d . . . and against movements in the radial directions by the aforementioned vertical cylindrical projections 18, 20 (FIG. 1). Furthermore, the inner material of the elastomeric layer 17 prevents relative movement between the heat-transfer parts of the interface due to volumetric compression caused by force F (FIG. 2B) and due to provision of recesses 27a, 27b, . . . 27n. The convex profile and the configuration of recesses 27a, 27b, . . . 27n are chosen so that the aforementioned condition is working within the entire range of working temperature of the device up to 350° C.

If necessary, the ICP reactor can be equipped with a second RF coil assembly 28. This assembly in general has the construction similar to the flat spiral coil assembly 16 of FIG. 1 and differs from it by the fact that the aforementioned coil 34 (FIG. 3) is helical and that the compression forces are directed radially inwardly. The assembly 28 consists of an inner ring 30 made from the same or similar elastomeric material as the material 17 and an outer ceramic ring 32. The surface of the inner ring 30 that faces the outer cylindrical surface of the cover 14 is also made convex and is flattened when the ring 30 is compressed by tightening the bolts 36a, 36b, 36c (see FIG. 4, which is a view in the direction of arrows A—A in FIG. 1). The compressed condition of the curved elastic ring 30 maintains this heat-transfer ring in constant contact with the outer surface of the cover 14 at working temperature up to 350° C.

Figure 3:
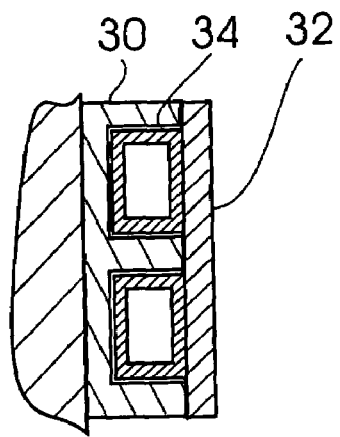
FIG. 3 is a view of the portion A of FIG. 1 on the enlarged scale.

The coil assembly 28 is intended for assisting the coil assembly 16 in generating the plasma. As shown in FIG. 3, which is an enlarged view of element A of FIG. 1, the inner elastomeric ring 30 contains the aforementioned RF coil 34 so that the coil is not in contact with the sidewall of the reactor housing 12. The inner elastomeric ring 30 may fit on the housing 12 with a tight fit, while the outer ceramic ring 32 is pressed to the inner ring with an inwardly radial force. Such a force can be created, e.g., by making the outer ceramic ring 32 from several parts, e.g., sectors 32a, 32b, 32c shown in FIG. 4. The mating ends of the sectors 32a, 32b, 32c can be secured together by bolts 36a, 36b, 36c, so that tightening of these bolts will squeeze the ceramic ring 30 around the inner elastomeric ring 30.

As has been mentioned above, the elastomeric material 17 (FIG. 1) and the inner elastomeric ring 30 (FIG. 3) are filled with finely dispersed thermally conductive and electrically non-conductive filler. Such filler may be represented by boron nitride, aluminum nitride, beryllium oxide, etc.

The elastomer can be produced from perfluoroelastomer-like elastomeric perfluoropolymers, high-temperature-resistant silicone elastomers, poly(phospho)zene elastomers, or the like. The filler particles may have the shapes of flakes, spherical bodies, or any other configurations. It is recommended that the filler material particles have dimensions within the range from several to 20 microns. In fluoro-containing matrices the concentration of filler is normally below 20%, while, e.g., in silicones the concentration may exceed 50%.

If necessary, in addition to the aforementioned fillers, the elastomeric material of the invention may also contain a combined mixing-assisting and compression-set reducing agent. This is a lubricant that improves properties of the elastomeric materials by improving mixing in the preparation of the composition for polymerization of the elastomeric material and by reducing the compression set. One example of the aforementioned combined mixing-assisting and compression-set reducing agent is Fomblin YR1800, which is a perfluoropolyether produced by Solvay Solexis, Inc., N.J., USA.

When during operation of the reactor 10 the temperature of the elastomer in the elastomeric material 17 or in the inner elastomeric ring 30 is increased, the compression force F (FIG. 2B) is reduced, and under the effect of thermal deformations the entire heat-transfer interface device 16 is deformed and is subjected to warping, sagging and formation of free volume that could impair the interface conditions. However, the compression force F acting on the elastomeric material softened under the effect of heat displaces this material into the aforementioned free spaces whereby the heat-transfer conditions are preserved. As the volume occupied by the recesses 27a, 27b, . . . 27n is significantly smaller than the volume of the entire elastomeric material, the provision of the recesses will not affect the heat-transfer properties of the device 16 as a whole.

Figure 4:
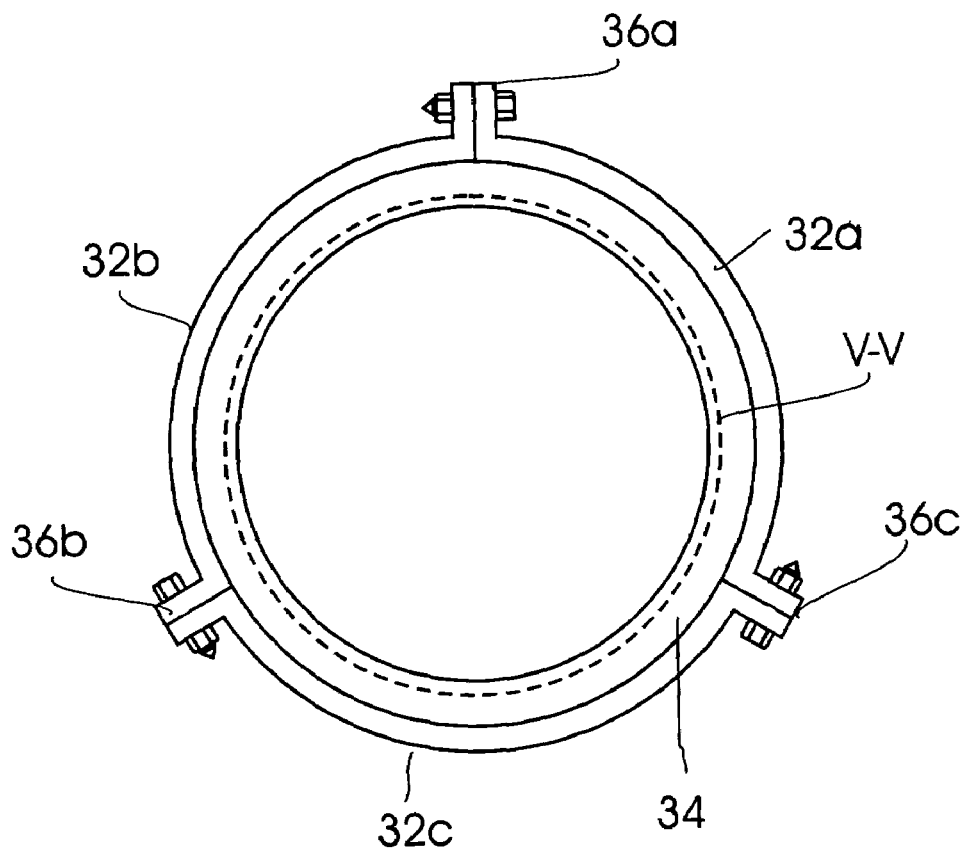
FIG. 4 is a view in the direction of line A—A of FIG. 1.
Figure 5:
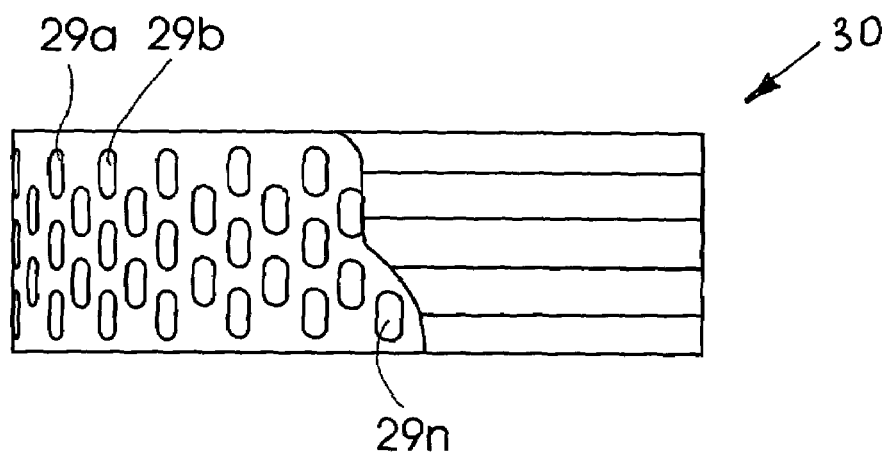
FIG. 5 is a developed sectional view of the inner elastomeric ring along the circular line V—V of FIG. 4.

As shown in FIG. 5 which is a developed sectional view of the inner elastomeric ring 30 of FIG. 4 along the circular line V—V, recesses 29a, 29b, . . . , 29n similar to the recesses 27a, 27b, . . . 27n of the heat-transfer device 16 are also formed in the elastomeric ring 30 and may be arranged with any desired pattern.

Furthermore, when the elastomer is compressed, it develops anisotropy in the direction of the compression. Since the material of the elastomer is filled with finely dispersed powder or fibers, the aforementioned compression will at least partially protect the heat-transfer device from the loss of thermal conductivity. The assembly can also be used for removal of heat from the RF coils 24 (34) and from the interior of the plasma-generation chamber by passing through the hollow coils a cooling medium and transferring the heat to the surrounding environment through the thermally conductive elastomers. The cooler/heater element is made hollow for circulation of the heating/cooling medium in order to selectively use this element for cooling or for heating the working gas in the plasma-generation chamber. Alternatively, the supply of the cooling medium can be discontinued, and the cooler/heater element and/or the hollow RF coil can be activated for transfer of heat to the plasma chamber in order to increase the temperature of the working gas in the chamber. If necessary, the heat transfer medium can be used for cooling the working gas in the plasma generation chamber.

Figure 6:
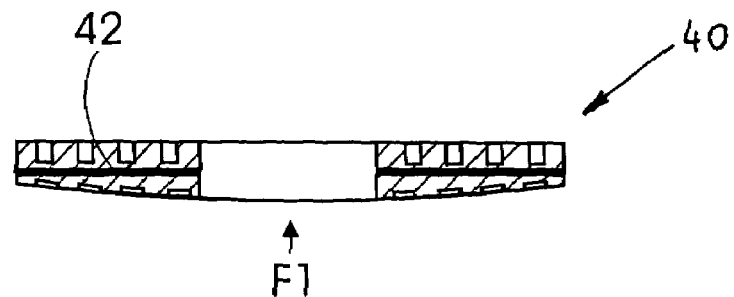
FIG. 6 is an embodiment of the device of the invention with a reinforcement member.

FIG. 6 is a cross-sectional view of a heat-transfer interface device 40 of the invention with a reinforcement element 42 made, e.g., from a fiber glass. The use of such reinforcement element 42 protects the device 40 from breaking under effect of compression force F1. The remaining part of the construction of the device 42 is the same as the embodiment shown in FIG. 2A.

For generation of plasma in the working chamber of the ICP reactor 10, the working chamber of the reactor is evacuated. A working gas, such as $O_2$, Ar, $CF_4$, $NF_3$, etc. is supplied to the working chamber of the reactor. The RF coils (24, 34) are energized and generate an electromagnetic field. As a result, plasma is exited inside the working chamber. At the same time, the hollow coils 24, 34 are cooled with a cooling agent, such as deionized water, which circulates through the coils when they energized. However, a part of the heat generated in the coils is dissipated to the surrounding materials and parts. Since in modern ICP reactors energies consumed by the coils may reach 10 kWt and even more, the residual heat on the coils may be on the order of 1 kWt or more. In spite of water-cooling, such high parasitic Joule heat may lead to significant increase in the temperature of the coils and of the surrounding material.

As has been explained above, since the elastomeric material 17 (ring 34) is fixed, when the temperature of the elastomer is increased, the compression force F (FIG. 2B) is reduced, and under the effect of thermal deformations the entire interface device 16 (28) is deformed and is subjected to warping, sagging and formation of free volume that could impair the interface conditions. However, the compression force acting on the elastomeric material softened under the effect of heat displaces this material into the aforementioned free spaces whereby the heat-transfer conditions are preserved. As the volume occupied by the recesses is significantly smaller than the volume of the entire elastomeric material, the provision of the recesses 27a, 27b, . . . 27n (29a, 29b, . . . 29n) will not affect the heat-transfer properties of the device as a whole.

Thus, heat-transfer interface device 16 (28) of the invention with a compressed elastomeric package between two fixed surfaces formed by the ceramic plate 19 and the reactor cover 14, as well as between the ceramic ring 32 and the side surface of the cover 14, prevents the RF coils from displacement and thermal deformation, and at the same time improves heat-removal conditions from the coils.

Since the elastomeric material is compressed to a significant degree, the distances between the aforementioned particles is reduced, whereby conditions of thermal conductivity between the elastomeric material and the support surface of the cover (14, 32) is improved. This results in higher heat transfer efficiency through the elastomeric material 17 (30) in both directions, depending on the mode of operation selected by activation or deactivation of the supply of the cooling/heating medium through the hollow RF coils 23 (34).

It is preferable to produce the coils 24, 34 from a hollow copper tube. The cooling medium may comprise deionized water, as well as various liquid oils of low viscosity. The cooling/heating medium for the cooler/heater may comprise liquid fluorocarbons such as oils known under trademark Fomblin distributed by Scientific Instrument Services, N.J., USA.

The method of the invention for improving heat-transfer conditions from a stationary heat-generating surface consists of providing an elastomeric material filled with particles or fibers of a filler having high thermal conductivity and electrical non-conductivity; providing the aforementioned elastomeric material with a convex surface at least on one side thereof; placing the aforementioned elastomeric material in a compressed state between a heat-generating object and a heat-receiving object, and thus maintaining stability of heat transfer irrespective of thermal deformation of the elastic body within the range of working temperatures of up to 350° C.

Thus, it has been shown that the invention provides a heat-transfer device for controlling and stabilizing thermal conditions of a processing chamber, wherein the heat-transfer device can be selectively used for removal or delivery of heat relative to the processing chamber. The invention also provides a coil assembly for inductively coupled plasma reactor with stable heat transfer interface between the coil and the reactor. The device has a reliable and stable thermally conductive and electrically non-conductive interface between the RF coil and the top of the reactor and provides generation of uniform plasma and thus uniform plasma treatment in the inductively coupled plasma reactor. RF coils and heating elements are embedded into an elastic material filled with a thermally conductive and electrically non-conductive filler. The invention also provides a method for improving and stabilizing heat-transfer interface between the RF coil and the inductively coupled plasma reactor.

Although the invention has been shown and described with reference to specific embodiments, it is understood that these embodiments should not be construed as limiting the areas of application of the invention and that any changes and modifications are possible, provided these changes and modifications do not depart from the scope of the attached patent claims. For example, the textures of recesses on the surface of the elastomeric rubber may be different from those shown in the drawings. The coils may have any other cross-section and may have a monolithic rather than the hollow cross-section. The coils may be replaced with electrically conductive rods for microwave excitation of plasma on higher frequencies. The coils may have a bell or jar configuration. Microwave-energy generation coils can be used instead of RF coils. The field of the invention is not limited only to the ICP reactors with RF coils, which has been given only as an example, and can be used in other fields. For example, the same principle can be applied to heat sinks for removal of heat from semiconductor chips to PC boards and environment, or for removal of heat from high-power laser diodes in bars or stocks.

The invention claimed is:

1. A method for controlling and stabilizing heat-transfer conditions between a source of heat and a heat-receiving object in a range of working temperatures, said method comprising the steps of:
providing a heat-transfer interface device, which is in heat-transfer engagement with said source of heat and said heat-receiving object and which is located between said source of heat and said heat-receiving object, said heat-transfer interface device comprising an elastomeric material filled with an electrically-nonconductive and thermally-conductive filler, said heat-transfer interface device having a space that can be filled with said elastomeric material during redistribution thereof in said heat-transfer interface device under the effect of variations in said working temperature, said heat-transfer interface device having one side facing said source of heat and another side facing said heat-receiving object;
compressing said heat-transfer interface device with a compression force that displaces said elastomeric material into said space, said compression force having a magnitude that maintains said heat-transfer interface device in a compressed state and maintains said heat-transfer engagement at variations of said working temperatures; and
said heat-transfer interface device having a working temperature up to 320° C.;
said heat-transfer interface device having a surface with a curvature, said space being selected from the group consisting of a space inside said elastomeric material and a space formed between said surface and one of said source of heat and said heat-receiving object;
wherein said space being selected from the group consisting of a space inside said elastomeric material and a space formed between said surface and one of said source of heat and said heat-receiving object, and
wherein said space inside said elastomeric material comprising recesses formed in the surface of said elastomeric material, said space formed between said heat-transfer interface device and one of said source of heat and said heat-receiving object being formed by curvature.

2. The method of claim 1, wherein said heat-transfer interface device has a substantially circular shape and wherein said surface with a curvature is a convex surface.

3. The method of claim 1, wherein said heat-transfer interface device has a substantially circular shape, and wherein said recesses are arranged in radial rows.

4. The method of claim 1, further comprising a step of reinforcing said heat-transfer interface device by placing a reinforcing member into said elastomeric material.

5. The method of claim 1, further comprising the step of using said heat-transfer interface device in a processing apparatus having a hollow coil located in said elastomeric material, said heat-receiving object comprising a cooling medium flowing though said hollow coil.

6. The method of claim 5, wherein said heat-transfer interface device normally operates at working temperatures up to 320° C.

7. The method of claim 6, wherein said hollow coil is an electrically heated coil.

8. The method of claim 7, wherein said heat-transfer interface device has a surface and wherein said space is selected from the group consisting of a space inside said elastomeric material and a space formed between said surface and one of said source of heat and said heat-receiving object.

9. The method of claim 5, wherein said processing apparatus is an inductive coupling plasma reactor and wherein said hollow coil is an RF coil.

10. The method of claim 9, wherein said heat-transfer interface device has a surface and wherein said space is selected from the group consisting of a space inside said elastomeric material and a space formed between said surface and one of said source of heat and said heat-receiving object.

11. The method of claim 10, wherein said space inside said elastomeric material is formed by recesses in the surface of said elastomeric material, and wherein said space between said heat-transfer interface device and one of said source of heat and said heat-receiving object is by the curvature on said surface.

12. The method of claim 11, wherein said heat-transfer interface device has a substantially circular shape and wherein said space formed between said surface and one of said source of heat and said heat-receiving object is formed by a convex surface.

13. The method of claim 12, wherein said elastomeric material is selected from the group consisting of perfluoroelastomer-type elastomeric perfluoropolymers, high-temperature-resistant silicone elastomers, and poly(phospho)zene elastomers.

14. The method of claim 13, wherein said filler material is selected from the group consisting of boron nitride, aluminum nitride, and beryllium oxide.

15. The method of claim 14, wherein said filler material further comprises a combined mixing-assisting and compression-set reducing agent.

16. The method of claim 10, wherein said space inside said elastomeric material is formed by recesses in the surface of said elastomeric material, and wherein said space between said heat-transfer interface device and one of said source of heat and said heat-receiving object is by the curvature on said surface.

17. The method of claim 16, wherein said heat-transfer interface device has a substantially circular shape and wherein said space formed between said surface and one of said source of heat and said heat-receiving object is formed by a convex surface.

18. The method of claim 17, wherein said elastomeric material is selected from the group consisting of perfluoroelastomer-type elastomeric perfluoropolymers, high-temperature-resistant silicone elastomers, and poly(phospho)zene elastomers.

19. The method of claim 18, wherein said filler material is selected from the group consisting of boron nitride, aluminum nitride, and beryllium oxide.

20. The method of claim 19, wherein said filler material further comprises a combined mixing-assisting and compression-set reducing agent.

21. A heat-transfer interface device for use in a range of working temperatures comprising:
a source of heat;
a heat-receiving object;
an elastomeric material filled with an electrically-nonconductive and thermally-conductive filler material, said elastomeric material being located between said source of heat and said heat-receiving object in a heat-transfer engagement therewith so that one side of said elastomeric material faces said source of heat and said another side faces said heat-receiving object;
said elastomeric material having recesses on the surface and being in a compressed state by compression between said source of heat and said heat-receiving object;
said elastomeric material having a space that can be filled with said elastomeric material during redistribution thereof in said heat-transfer interface device under the effect of variations in said working temperature;
said elastomeric material being compressed with a compression force that displaces said elastomeric material into said space, said compression force having a magnitude that maintains said heat-transfer interface device in a compressed state and maintains said heat-transfer engagement at variations of said working temperatures that may be have a value up to 320° C.;
said heat-transfer interface device having a surface with a curvature, and said space being selected from the group consisting of a space inside said elastomeric material and a space formed between said surface and one of said source of heat or said heat-receiving object;
said space inside said elastomeric material being formed by recesses in the surface of said elastomeric material, and said space between said heat-transfer interface device and one of said source of heat and said heat-receiving object being formed by said curvature on.

22. The device of claim 21, wherein said heat-transfer interface device has a substantially circular shape and wherein said space between said surface and one of said source of heat and said heat-receiving object is formed by a convex surface.

23. The device of claim 22, wherein said heat-transfer interface device has a substantially circular shape and wherein said recesses are arranged in radial rows.

24. The device of claim 21, wherein said heat-transfer interface device has a substantially circular shape and wherein said space between said surface and one of said source of heat and said heat-receiving object is formed by a convex surface, said recesses being arranged in radial rows; said filler material comprising a combined mixing-assisting and compression-set reducing agent, and said combined mixing-assisting and compression-set reducing agent being perfluoropolyether.

25. The device of claim 21, further comprising a reinforcing member in said elastomeric material.

26. The device of claim 21, further provided with a hollow coil located in said elastomeric material, said heat-receiving object comprising a cooling medium flowing though said hollow coil.

27. The device of claim 26, wherein said hollow coil is an electrically heated coil.

28. The device of claim 27, wherein said device is a heat-transfer interface device located in an inductive coupling plasma reactor having a plasma generation chamber, said plasma generation chamber comprising said source of heat.

29. The device of claim 28, wherein said elastomeric material comprises perfluoroelastomer polymer.

30. The device of claim 29, wherein said filler material is selected from the group consisting of boron nitride, aluminum nitride, beryllium oxide, and carbon.

31. The device of claim 30, wherein said filler material further comprises a combined mixing-assisting and compression-set reducing agent.

32. The device of claim 31, wherein said combined mixing-assisting and compression-set reducing agent is perfluoropolyether.

* * * * *